(12) United States Patent
Salameh (10) Patent No.: US 11,606,068 B2
(45) Date of Patent: Mar. 14, 2023

(54) POWER AMPLIFIER LINEARIZER

(71) Applicant: pSemi Corporation, San Diego, CA (US)

(72) Inventor: Daoud Salameh, Reading (GB)

(73) Assignee: pSemi Corporation, San Diego, CA (US)

(*) Notice: Subject to any disclaimer, the term of this patent is extended or adjusted under 35 U.S.C. 154(b) by 67 days.

(21) Appl. No.: 17/165,493

(22) Filed: Feb. 2, 2021

(65) Prior Publication Data

US 2022/0247361 A1 Aug. 4, 2022

(51) Int. Cl.
*H03F 1/32* (2006.01)
*H03F 3/21* (2006.01)

(52) U.S. Cl.
CPC ............ *H03F 1/3205* (2013.01); *H03F 3/21* (2013.01); *H03F 2200/294* (2013.01)

(58) Field of Classification Search
CPC ..... H03F 1/3205; H03F 3/21; H03F 2200/294
USPC ........................................... 330/302–302, 277
See application file for complete search history.

(56) References Cited

U.S. PATENT DOCUMENTS

| | | | |
|---|---|---|---|
| 5,146,177 A * | 9/1992 | Katz | ................. H03F 3/608 333/17.2 |
| 5,661,437 A | 8/1997 | Nishikawa | |
| 9,197,194 B2 | 11/2015 | Reedy et al. | |
| 2014/0300417 A1 | 10/2014 | Xu et al. | |

(Continued)

FOREIGN PATENT DOCUMENTS

| | | |
|---|---|---|
| EP | 1936799 | 6/2008 |
| EP | 3525341 | 8/2019 |

(Continued)

OTHER PUBLICATIONS

Salameh, Daoud, patent application filed in the USPTO on Feb. 2, 2021 entitled "Power Amplifier Equalizer", U.S. Appl. No. 17/165,198, 60 pgs.

(Continued)

*Primary Examiner* — Hafizur Rahman
*Assistant Examiner* — Khiem D Nguyen
(74) *Attorney, Agent, or Firm* — Jaquez Land Greenhaus & McFarland LLP; John Land, Esq.

(57) ABSTRACT

Circuits and methods for achieving good amplifier AM-AM and AM-PM metrics while achieving good power, PAE, linearity, and EVM performance. Embodiments compensate for a non-linear distortion profile (e.g., an AM-PM and/or AM-AM profile) in an amplifier by pre-processing an input signal, such as a radio-frequency signal, to alter the non-linear distortion profile of the input signal so as to compensate for the non-linear distortion profile imposed by a coupled device, such as an amplifier. An inventive aspect includes linearizing an output from an amplifier having a first non-linear distortion profile, including passing an input signal having a second non-linear distortion profile through a reflective hybrid coupler to a non-linear termination circuit, and reflecting a modified input signal from the non-linear termination circuit back through the reflective hybrid coupler as an output signal, the output signal having a third non-linear distortion profile shaped to compensate for the first non-linear distortion profile.

23 Claims, 7 Drawing Sheets

(56) References Cited

U.S. PATENT DOCUMENTS

| | | | |
|---|---|---|---|
| 2015/0091668 A1* | 4/2015 | Solomko | H01P 5/18 |
| | | | 333/111 |
| 2016/0020740 A1 | 1/2016 | Arcudia | |
| 2019/0158030 A1 | 5/2019 | Hou et al. | |
| 2019/0280654 A1 | 9/2019 | Darwish | |
| 2022/0247358 A1 | 8/2022 | Salameh et al. | |

FOREIGN PATENT DOCUMENTS

| KR | 1020040106018 | 12/2004 |
|---|---|---|
| KR | 100845661 | 7/2008 |
| WO | 2022169713 | 8/2022 |

OTHER PUBLICATIONS

Nguyen, Khiem D., Office Action received from the USPTO dated Jun. 8, 2022 for U.S. Appl. No. 17/165,198, 18 pgs.

Fedi, Giulio, International Search Report and Written Opinion receivd from the EPO dated May 2, 2022 for appln. No. PCT/US2022/014113, 17 pgs.

Rezaei, et al., "A Systematic Methodology to Design Analog Predistortion Linearizer for Dual Inflection Power Amplifiers", Microwave Symposium Digest (MTT), 2011 IEEE MTT-S International, IEEE, Jun. 5, 2011, pp. 1-4.

Zhou, et al. "A Millimeter-Wave Predistortion Linearizer for Traveling Wave Tube Amplifiers", 2012 International Conference on Microwave and Millimeter Wave Technology (ICMMT), IEEE, May 5, 2012, pp. 1-3.

Park, Hye Lyun, International Search Report and Written Opinion received from KIPO dated May 18, 2022 for appln. No. PCT/US2022/014594, 10 pgs.

* cited by examiner

POWER AMPLIFIER LINEARIZER

CROSS-REFERENCE TO RELATED APPLICATIONS

This invention may be related to the following patent application, assigned to the assignee of the present invention, the contents of which are incorporated by reference:
U.S. patent application Ser. No. 17/165,198, filed Feb. 2, 2021, entitled "Power Amplifier Equalizer".

BACKGROUND

(1) Technical Field

This invention relates to electronic circuitry, and more particularly to electronic amplifier circuits.

(2) Background

Electronic amplifiers, including power amplifiers (PA) and low-noise amplifiers (LNAs), are used in a multitude of electronic systems, particularly radio frequency (RF) systems, such as radios, cellular telephones, WiFi, etc. In many applications, important design parameters for an amplifier, particularly a power amplifier, include amplitude-to-amplitude modulation (AM-AM) variation versus output power, amplitude-to-phase modulation (AM-PM) variation versus output power, power added efficiency (PAE), power, and linearity.

AM-AM conversion is a measure of non-linear distortion which happens due to undesired amplitude changes. More specifically, AM-AM distortion is the distortion of the magnitude of the gain characteristic as a function of input amplitude. The input amplitude modulates the gain and thus the output amplitude. An example of AM-AM distortion is an amplifier's compression characteristic, where high input signals cause the gain characteristic to depart from a linear response. The compression of the gain implies that the output amplitude increases by less than an associated increase in input amplitude. One can also observe gain expansion. This often occurs in Class AB amplifiers before the amp starts to compress.

AM-to-PM conversion is a measure of non-linear distortion of the amount of undesired phase deviation (PM) that is caused by amplitude variations (AM) of the system. AM-to-PM conversion is usually defined as the change in output phase for a 1-dB increment in a power-sweep applied to an amplifier's input (i.e., at the 1 dB gain compression point). An ideal amplifier would have no interaction between its phase response and the power level of the input signal, and thus have a flat conversion curve.

PAE is a metric for rating the efficiency of an amplifier, particularly a power amplifier, that takes into account the effect of the gain of the amplifier. More specifically, the PAE of an amplifier is the ratio of produced or added signal power (difference between output and input power) and the DC input power for the amplifier.

In power amplifiers in particular, AM-AM and AM-PM variation versus output power have a dominant effect on linearity and error vector magnitude (EVM) performance. In an amplifier based on field-effect transistors (FETs), AM-PM and AM-AM behavior is influenced by FET gate-source non-linear capacitance ($C_{GS}$). Degradation in linearity and EVM performance can be reduced by operating further away from the 1 dB compression point (P1dB), which is the output power level at which the gain of the amplifier decreases 1 dB from its constant value (once an amplifier reaches its P1dB point, it goes into compression and becomes a non-linear device, producing significant distortion, harmonics, and intermodulation products). However, operation far below P1dB significantly degrades PAE performance.

In some integrated circuit (IC) FET fabrication technologies, good AM-AM and AM-PM metrics can only be achieved at high current density, but at the expense of high PAE and thermal performance. In other IC FET fabrication technologies, good power and PAE metrics can be achieved at low current density but AM-AM and AM-PM metrics vary significantly close to P1dB.

The linearity and EVM performance of an amplifier can be improved also using digital pre-distortion (DPD). However, DPD requires a feedback loop and complex circuitry, both of which raise their own design and performance issues.

Accordingly, there is a need for achieving good AM-AM and AM-PM metrics while concurrently achieving good power, PAE, linearity, and EVM performance in an amplifier. The present invention addresses this need.

SUMMARY

The present invention encompasses circuits and methods for achieving good AM-AM and AM-PM metrics while concurrently achieving good power, PAE, linearity, and EVM performance in an amplifier. Embodiments of the present invention provide a new linearization approach which compensates for AM-PM variation in an amplifier by pre-processing an input signal, such as a radio-frequency signal, to alter the AM-PM profile of the input signal so as to compensate for (essentially reverse or pre-distort) the AM-PM profile imposed by a coupled amplifier.

A first embodiment includes a linearizer circuit, including a reflective hybrid coupler configured to receive an input signal to be linearized, the input signal having a first AM-PM profile, a first reflective modulation device coupled to the direct port of the reflective hybrid coupler, and a second reflective modulation device coupled to the coupled port of the reflective hybrid coupler, wherein the first and second reflective modulation devices modify the first AM-PM profile of the input signal to a modified output signal having a second AM-PM profile shaped to compensate for a third AM-PM profile imposed on the modified output signal by another device.

Another aspect of the invention includes a method of linearizing an output from an amplifier having a first AM-PM profile, including passing an input signal having a second AM-PM profile through a reflective hybrid coupler to a non-linear termination circuit, and reflecting a modified input signal from the non-linear termination circuit back through the reflective hybrid coupler as an output signal, the output signal having a third AM-PM profile shaped to compensate for the first AM-PM profile.

An added benefit of the invention is that the AM-AM profile is also slightly pre-distorted, an improvement which can be utilized to further extend the 1 dB compression point (P1dB) of the amplifier. Accordingly, more generally, embodiments of the invention include a reflective hybrid coupler configured to receive an input signal to be linearized, the input signal having a first non-linear distortion profile, and a non-linear termination circuit coupled to the reflective hybrid coupler and configured to reflect a modified input signal back through the reflective hybrid coupler as an output signal, the output signal having a second non-linear distortion profile.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses circuits and methods for achieving good AM-AM and AM-PM metrics while concurrently achieving good power, PAE, linearity, and EVM performance in an amplifier. Embodiments of the present invention provide a new linearization approach which compensates for AM-PM variation in an amplifier by pre-processing an input signal, such as a radio-frequency (RF) signal, to alter the AM-PM profile of the input signal so as to compensate for (essentially reverse or pre-distort) the AM-PM profile imposed by a coupled amplifier. An added benefit of the invention is that the AM-AM profile is also slightly pre-distorted, an improvement which can be utilized to further extend the 1 dB compression point (P1dB) of the amplifier.

The new linearization approach couples an input signal through the input port of a reflective hybrid coupler having direct and coupled ports each terminated with a FET. The FET may be, for example, an N-type enhancement MOSFET. The output port (also known as the "isolated" port) of the reflective hybrid coupler is connected to the input of an amplifier, such as a power amplifier, having one or more amplification stages.

Figure 1A:
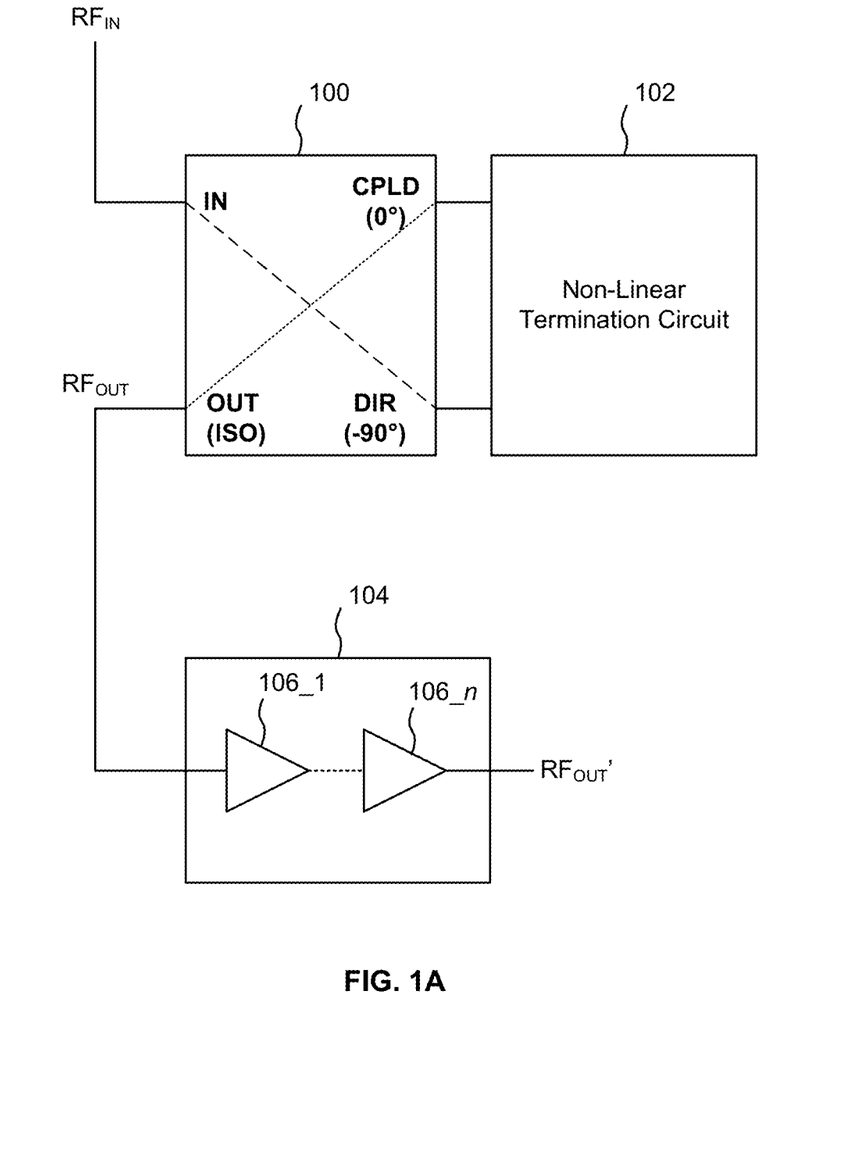
FIG. 1A is a schematic diagram of one embodiment of a linearizer circuit using a reflective hybrid coupler and a non-linear termination circuit.

FIG. 1A is a schematic diagram of one embodiment of a linearizer circuit using a reflective hybrid coupler 100 and a non-linear termination circuit 102. As is known in the art, a reflective hybrid coupler is a four-port device (input, direct, coupled, isolated) that may be used either to equally split an input signal with a resultant 90° phase shift between output ports, or to combine two signals while maintaining high isolation between the ports. Reflective hybrid couplers are also known as quadrature hybrids because a signal applied to any input will result in two equal amplitude signals that are 90° apart.

In the illustrated example, an input signal (shown in this example as an RF input signal $RF_{IN}$) is coupled to the input port IN of the reflective hybrid coupler 100. One half of the power (−3 dB) of the input signal flows to the direct port DIR and the other half of the power (−3 dB) of the input signal flows to the coupled port CPLD. As indicated, the direct port DIR and the coupled port CPLD have a 90° phase difference. The output port OUT of the reflective hybrid coupler 100 provides an output signal (shown in this example as an RF output signal $RF_{OUT}$) having a modified AM-PM profile to the input of an amplifier 104. The amplifier 104 may include one or more amplifier stages 106_1-106_n and outputs an amplified signal (shown in this example as an RF output signal $RF_{OUT}'$) that has a compensated AM-PM profile. The amplifier 104 may be, for example, an LNA or a PA, and may, for example, have a single-ended, differential, or balanced differential architecture.

Within the reflective hybrid coupler 100, the input signal is split into Direct and Coupled signals that travel to the direct port DIR and the coupled port CPLD, respectively, which are coupled to a non-linear termination circuit 102. A characteristic of the non-linear termination circuit 102 is that it includes devices (such as an N-type enhancement MOSFETs) that have an inherent non-linear characteristic modulated by varying (modulating) the input voltage $V_{GS}$ from the Direct and Coupled signals. Further, since such devices typically have a non-linear gate-source capacitance, $C_{GS}$, that non-linearity adds to the overall non-linearity of the FET.

Figure 1B:
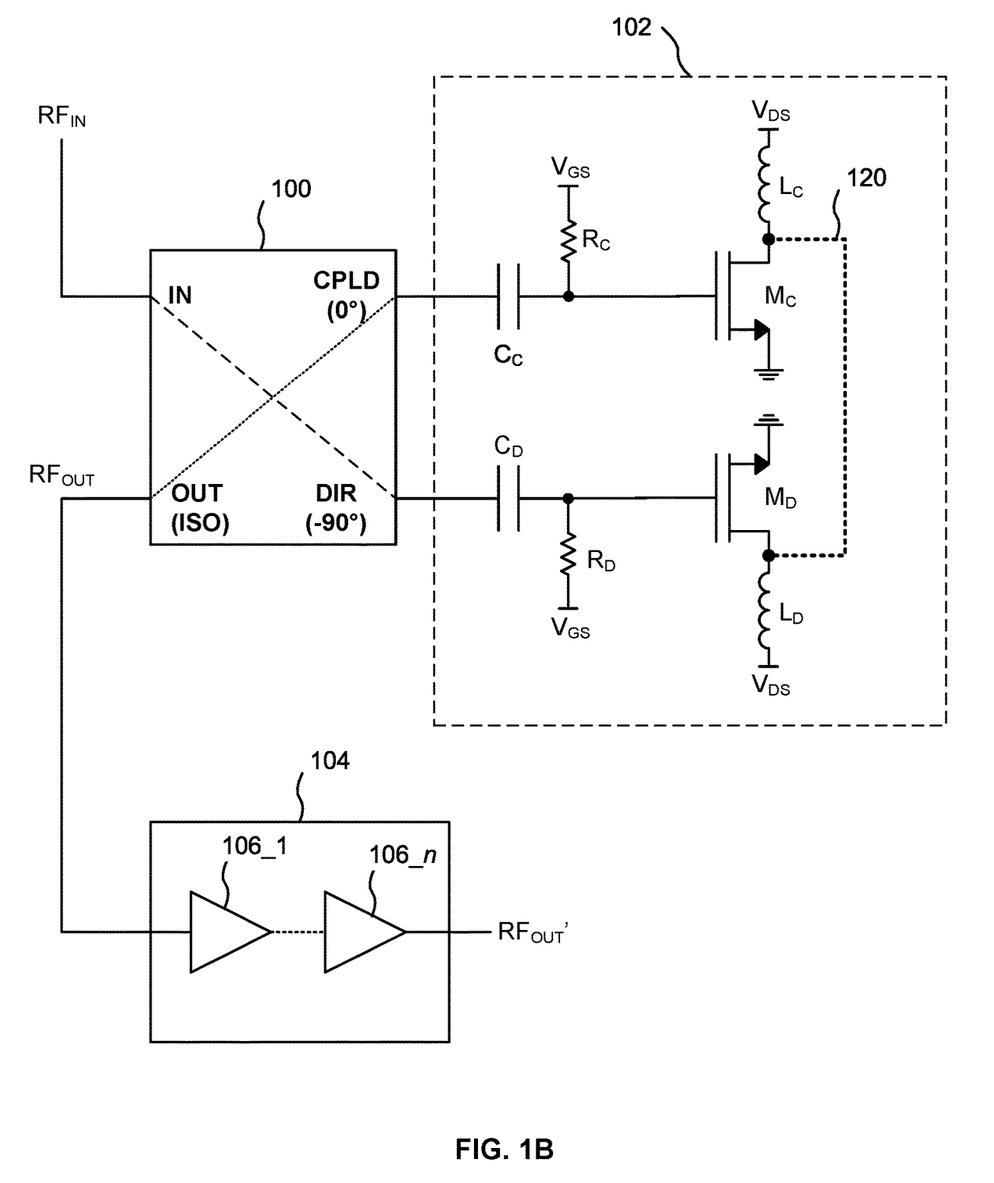
FIG. 1B is a schematic diagram of the linearizer circuit of FIG. 1A using a particular example of a non-linear termination circuit.

A variety of such FET-based circuits with such characteristics may be used. For example, FIG. 1B is a schematic diagram of the linearizer circuit of FIG. 1A using a particular example of a non-linear termination circuit 102. More particularly, the coupled port CPLD is coupled through a DC-blocking capacitor $C_C$ to a control terminal of a reflective modulation device; in the illustrated example, the reflective modulation device is a FET $M_C$, and the control terminal is the gate of the FET $M_C$. Similarly, the direct port DIR is coupled through a DC-blocking capacitor $C_D$ to a control terminal of a reflective modulation device; in the illustrated example, the reflective modulation device is a FET $M_D$, and the control terminal is the gate of the FET $M_D$. In the illustrated example, a bias voltage $V_{GS}$ is applied to the gate of each FET $M_C$, $M_D$ via respective gate resistors $R_C$, $R_D$, and the drain of each FET $M_C$, $M_D$ is coupled to a drain-source bias voltage supply $V_{DS}$ (e.g., +1V) through a respective load inductor $L_C$, $L_D$. In alternative embodiments, the drain of both FETs $M_C$, $M_D$ may be coupled in common to the drain-source bias voltage supply $V_{DS}$ through a common load inductor $L_C$, in which case inductor $L_D$ would be omitted (this alternative coupling is shown as a dotted line 120 in FIG. 1B).

The load inductors $L_C$ and $L_D$ not only pass current to the FETs $M_C$ and $M_D$, respectively, but also provide a high drain impedance for the FETs $M_C$ and $M_D$, respectively. In some applications, the drain impedance for the FETs $M_C$ and $M_D$ may be in the range of about 0.5 nH to about 2 nH. In many applications, the load inductors will operate at high enough frequencies that they can be fabricated as an IC component rather than be off-chip. A load inductor may also be settable or adjustable using such technologies as fusible links or laser trimming. A load inductor may also be digitally programmable, such as is taught in U.S. Pat. No. 9,197,194, issued on Nov. 24, 2015, entitled "Method and Apparatus for Use in Tuning Reactance in an Integrated Circuit Device", assigned to the assignee of the present invention and hereby incorporated by reference.

When the Coupled signal reaches the gate of the FET $M_C$, that signal is modulated by the FET $M_C$. The high drain impedance (due to load inductor $L_C$) of the FET $M_C$ causes the Coupled signal to reflect back directly to the OUT port. Similarly, when the Direct signal reaches the gate of the FET $M_D$, that signal is modulated by the FET $M_D$. The high drain impedance (due to load inductor $L_D$) of the FET $M_D$ causes the Direct signal to reflect back to the OUT port via coupling within the reflective hybrid coupler 100. The combined reflected signals ($RF_{OUT}$ in this example) from the OUT port then flow to the input of the amplifier 104.

Of note, because the FETs $M_C$, $M_D$ are non-linear devices, the signals reflected back to the OUT port of the reflective hybrid coupler 100 will have an altered AM-PM profile generated by the non-linear FETs. The round trip of the input signal ($RF_{IN}$ in this example) through the reflective hybrid coupler 100 essentially reverses the AM-PM profile of the input signal compared to the AM-PM profile that would be imposed by the amplifier 104. Accordingly, when the altered AM-PM profile of the input signal is applied to the amplifier 104, the amplifier 104 will generate a modified output signal ($RF_{OUT}'$ in this example) in which the altered AM-PM profile from the non-linear termination circuit 102 substantially compensates for the AM-PM profile imposed by the amplifier 104, resulting in a flatter AM-PM profile for the final output signal. The AM-PM compensation from the non-linear termination circuit 102 consequently improves the EVM metric and allows operation of the amplifier 104 closer to its P1dB point, where higher efficiency is achieved.

It should be noted that other non-linear termination circuits 102 may be used in place of the specific circuit illustrated in FIG. 1B. For example, either or both of the single FET's $M_C$, $M_D$, may be replaced by a stack of series-coupled FETs in order to withstand higher voltages $V_{DS}$. The FET's $M_C$, $M_D$ may be biased in a variety of known ways, and an impedance matching network may be placed before or after one or both of the capacitors $C_C$ and $C_D$. The FET $M_C$ may differ (e.g., with respect to size) from the FET $M_D$. The bias and/or matching network of the FET $M_C$ may differ from the bias or matching network of the FET $M_D$. In some embodiments, the FETs $M_C$ and $M_D$ may be configured as a common-gate FET amplifier structure in which the input voltage modulates $V_{GS}$ and thus $C_{GS}$.

Figure 2A:
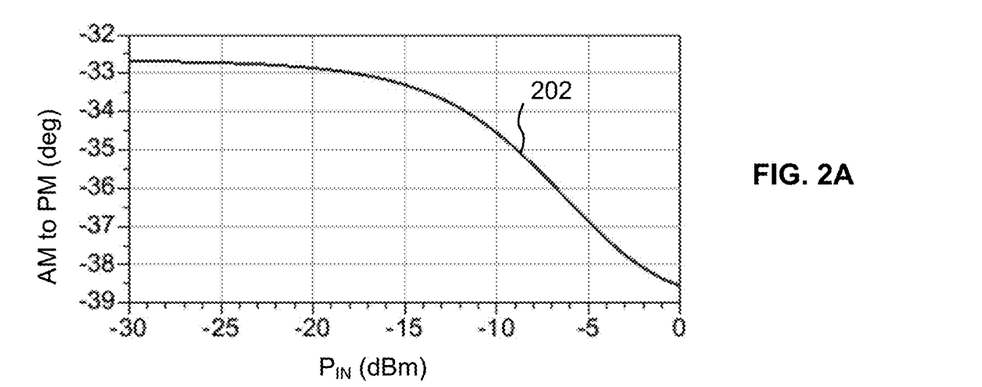
FIG. 2A is a graph of AM to PM variation versus input power $P_{IN}$ for a modeled embodiment of the reflective hybrid coupler and non-linear termination circuit, illustrating a negative-slope altered AM-PM profile intended to compensate for the positive-slope profile generated by the amplifier.

FIG. 2A is a graph of AM to PM variation versus input power $P_{IN}$ for a modeled embodiment of the reflective hybrid coupler 100 and non-linear termination circuit 102, illustrating a negative-slope altered AM-PM profile 202 (i.e., a pre-distortion curve) intended to compensate for the positive-slope profile generated by the amplifier 104. Note the shape of the altered AM-PM profile 202 may be adjusted to suit a particular application by adjusting $V_{GS}$, $V_{DS}$, and/or the load inductors $L_C$, $L_D$ in the circuit shown in FIG. 1B, and/or by re-sizing the FETs $M_C$ and/or $M_D$ and retuning $V_{GS}$.

Figure 2B:
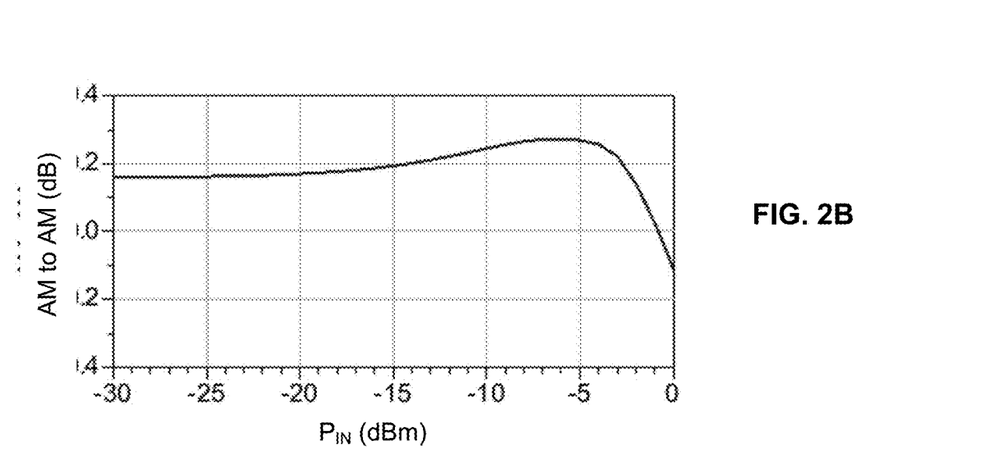
FIG. 2B is a graph of AM to AM variation versus input power $P_{IN}$ for a modeled embodiment of the reflective hybrid coupler and non-linear termination circuit, showing that the combined circuit exhibits no loss, but rather a small gain.

FIG. 2B is a graph of AM to AM variation versus input power $P_{IN}$ for a modeled embodiment of the reflective hybrid coupler 100 and non-linear termination circuit 102, showing that the combined circuit exhibits no loss, but rather a small gain. The gain is because the FETs $M_C$, $M_D$ also behave as amplifiers. In one modeled embodiment, the gain was about 0.2 dB. A benefit of the invention is that, since the AM-AM profile is also slightly pre-distorted, that improvement can be utilized to further extend the 1 dB compression point (P1dB) of the amplifier 104.

Figure 3A:
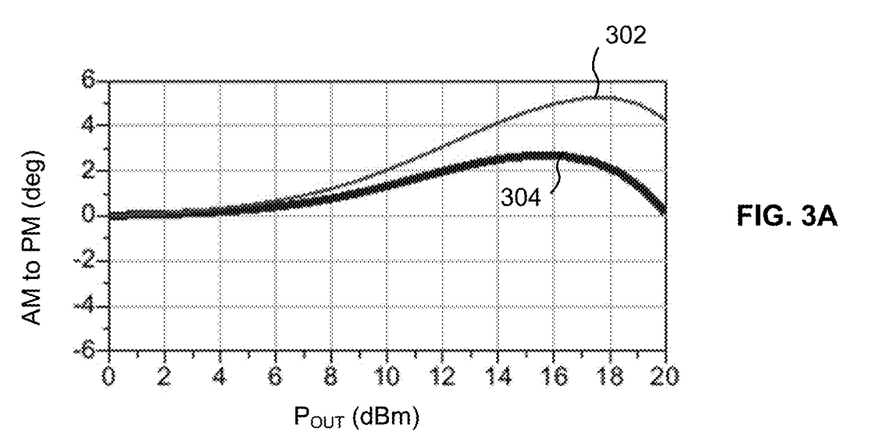
FIG. 3A is a graph of AM to PM variation versus output power $P_{OUT}$ for a modeled embodiment of the amplifier alone and of the reflective hybrid coupler and non-linear termination circuit and coupled amplifier operating together.

FIG. 3A is a graph of AM to PM variation versus output power $P_{OUT}$ for a modeled embodiment of the amplifier 104 alone (graph line 302) and of the reflective hybrid coupler 100 and non-linear termination circuit 102 and coupled amplifier 104 operating together (graph line 304). As the graph indicates, the AM-PM metric is flatter—and thus better—when the reflective hybrid coupler 100 and non-linear termination circuit 102 are in place and operational. Consequently, the EVM metric will be improved and thus allow operation of the amplifier 104 closer to its P1dB point, thereby achieving higher efficiency for the amplifier 104.

Figure 3B:
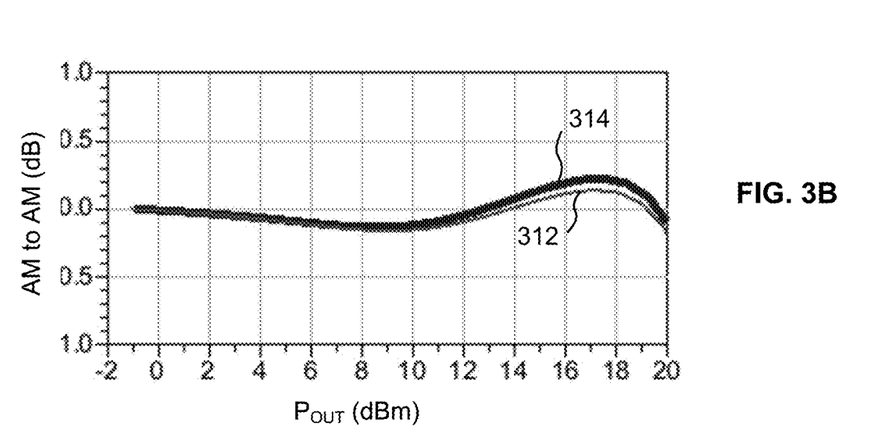
FIG. 3B is a graph of AM to AM variation versus output power $P_{OUT}$ a modeled embodiment of the amplifier alone and of the reflective hybrid coupler and non-linear termination circuit and coupled amplifier operating together.

FIG. 3B is a graph of AM to AM variation versus output power $P_{OUT}$ for a modeled embodiment of the amplifier 104 alone (graph line 312) and of the reflective hybrid coupler 100 and non-linear termination circuit 102 and coupled amplifier 104 operating together (graph line 314). As the graph indicates, the improvement in the modified AM-PM profile of the final output signal from the amplifier 104 is achieved with almost no undesirable effect on the AM-AM profile.

More generally, embodiments of the invention include a reflective hybrid coupler configured to receive an input signal to be linearized, the input signal having a first non-linear distortion profile (e.g., an AM-PM and/or AM-AM profile), and a non-linear termination circuit coupled to the reflective hybrid coupler and configured to reflect a modified input signal back through the reflective hybrid coupler as an output signal, the output signal having a second non-linear distortion profile. The second non-linear distortion profile may be shaped to compensate for a third non-linear distortion profile imposed on the output signal by another device, such as an amplifier.

System Aspects

Embodiments of the present invention are useful in a wide variety of larger circuits and systems for performing a range of functions, including (but not limited to) RF power amplifiers and RF LNAs. Such functions are useful in a variety of applications, such as radio systems (including cellular radio systems), radar systems (including phased array and automotive radar systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, and WiFi (e.g., 802.11a, b, g, ac, ax), as well as other radio communication standards and protocols.

Figure 4:
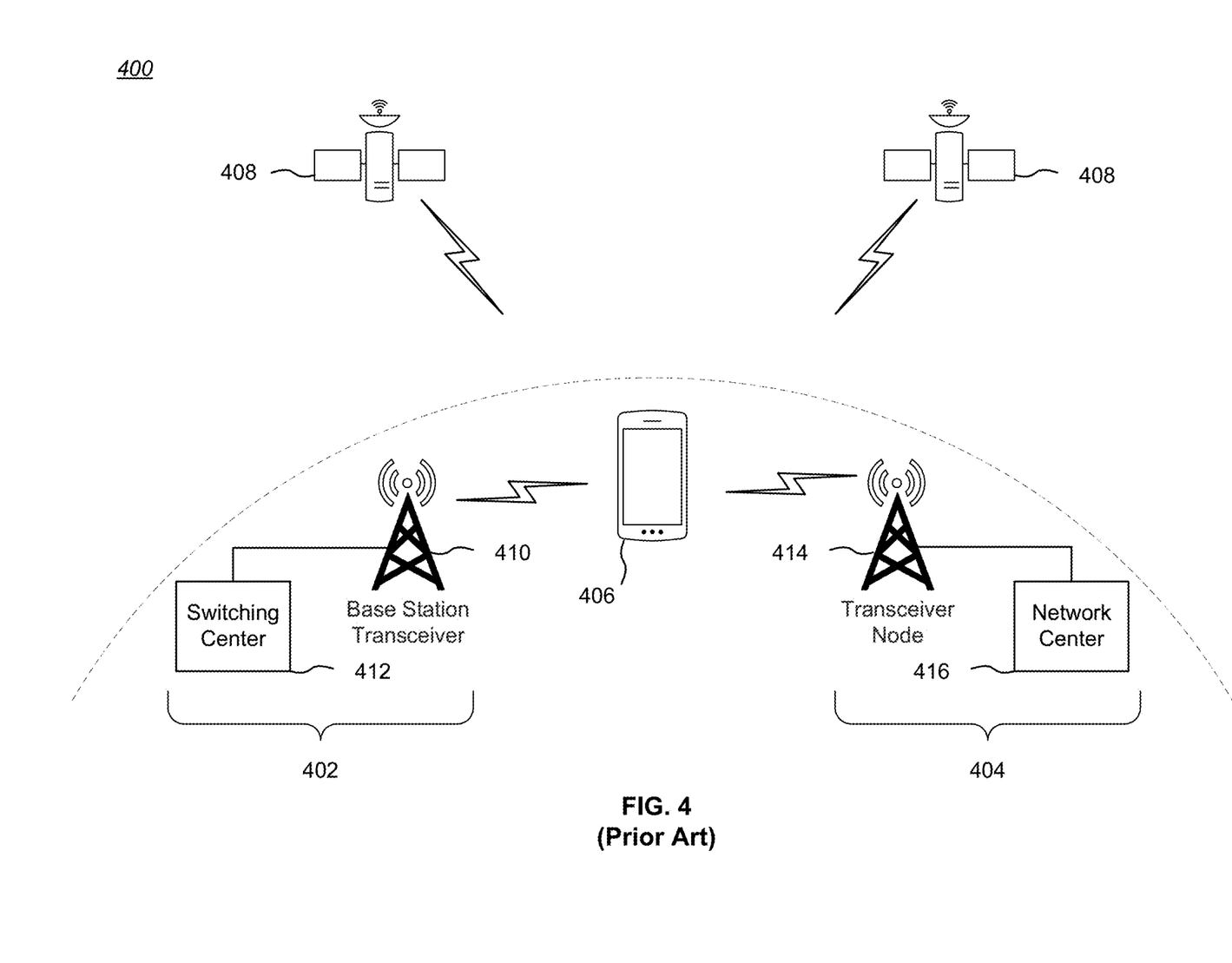
FIG. 4 illustrates an exemplary prior art wireless communication environment comprising different wireless communication systems, and may include one or more mobile wireless devices.

As an example of wireless RF system usage, FIG. 4 illustrates an exemplary prior art wireless communication environment 400 comprising different wireless communication systems 402 and 404, and may include one or more mobile wireless devices 406.

A wireless device 406 may be capable of communicating with multiple wireless communication systems 402, 404 using one or more of the telecommunication protocols noted above. A wireless device 406 also may be capable of communicating with one or more satellites 408, such as navigation satellites (e.g., GPS) and/or telecommunication satellites. The wireless device 406 may be equipped with multiple antennas, externally and/or internally, for operation on different frequencies and/or to provide diversity against deleterious path effects such as fading and multi-path interference. A wireless device 406 may be a cellular phone, a personal digital assistant (PDA), a wireless-enabled computer or tablet, or some other wireless communication unit or device. A wireless device 406 may also be referred to as a mobile station, user equipment, an access terminal, or some other terminology.

The wireless system 402 may be, for example, a CDMA-based system that includes one or more base station transceivers (BSTs) 410 and at least one switching center (SC) 412. Each BST 410 provides over-the-air RF communication for wireless devices 406 within its coverage area. The SC 412 couples to one or more BSTs in the wireless system 402 and provides coordination and control for those BSTs.

The wireless system 404 may be, for example, a TDMA-based system that includes one or more transceiver nodes 414 and a network center (NC) 416. Each transceiver node 414 provides over-the-air RF communication for wireless devices 406 within its coverage area. The NC 416 couples to one or more transceiver nodes 414 in the wireless system 404 and provides coordination and control for those transceiver nodes 414.

In general, each BST 410 and transceiver node 414 is a fixed station that provides communication coverage for wireless devices 406, and may also be referred to as base stations or some other terminology. The SC 412 and the NC 416 are network entities that provide coordination and control for the base stations and may also be referred to by other terminologies.

Figure 5:
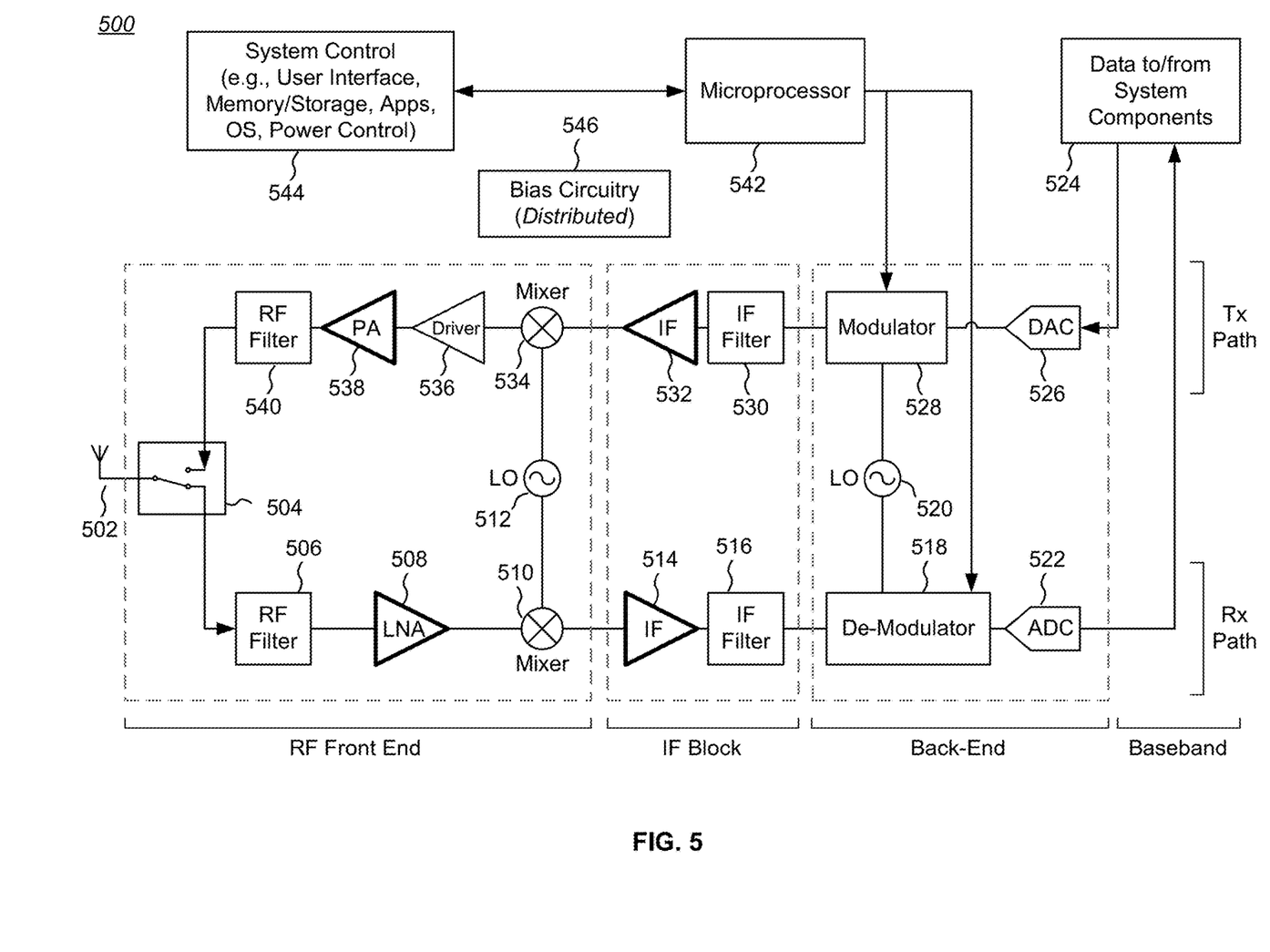
FIG. 5 is a block diagram of a transceiver that might be used in a wireless device, such as a cellular telephone, and which may beneficially incorporate an embodiment of the present invention for improved performance and power efficiency.

An important aspect of any wireless system, including the systems shown in FIG. 4, is in the details of how the component elements of the system perform. FIG. 5 is a block diagram of a transceiver 500 that might be used in a wireless device, such as a cellular telephone, and which may beneficially incorporate an embodiment of the present invention for improved performance and power efficiency. As illustrated, the transceiver 500 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different).

The receiver path Rx receives over-the-air RF signals through an antenna 502 and a switching unit 504, which may be implemented with active switching devices (e.g., field effect transistors or FETs), or with passive devices that implement frequency-domain multiplexing, such as a diplexer or duplexer. An RF filter 506 passes desired received RF signals to an LNA 508, the output of which is combined in a mixer 510 with the output of a first local oscillator 512 to produce an intermediate frequency (IF) signal. The linearity characteristics of the LNA 508 may benefit from the improvement brought about by use of the present invention. The IF signal may be amplified by an IF amplifier 514 and subjected to an IF filter 516 before being applied to a demodulator 518, which may be coupled to a second local oscillator 520. The linearity characteristics of the IF amplifier 514 may benefit from the improvement brought about by use of the present invention. The demodulated output of the demodulator 518 is transformed to a digital signal by an analog-to-digital converter 522 and provided to one or more system components 524 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 524 is transformed to an analog signal by a digital-to-analog converter 526, the output of which is applied to a modulator 528, which also may be coupled to the second local oscillator 520. The modulated output of the modulator 528 may be subjected to an IF filter 530 before being amplified by an IF amplifier 532. The linearity characteristics of the IF amplifier 532 may benefit from the improvement brought about by use of the present invention. The output of the IF amplifier 532 is then combined in a mixer 534 with the output of the first local oscillator 512 to produce an RF signal. The RF signal may be amplified by a driver 536, the output of which is applied to a power amplifier (PA) 538. The linearity characteristics of the PA 538 may benefit from the improvement brought about by use of the present invention. The amplified RF signal may be coupled to an RF filter 540, the output of which is coupled to the antenna 502 through the switching unit 504.

The operation of the transceiver 500 is controlled by a microprocessor 542 in known fashion, which interacts with system control components (e.g., user interfaces, memory/storage devices, application programs, operating system software, power control, etc.). In addition, the transceiver 500 will generally include other circuitry, such as bias circuitry 546 (which may be distributed throughout the transceiver 500 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 500 may be in a positioned in a different order (e.g., filters) or omitted. Other components can be (and usually are) added (e.g., additional filters, impedance matching networks, variable phase shifters/attenuators, power dividers, etc.).

As discussed above, the current invention achieves good power, PAE, linearity, and EVM performance in an amplifier. As a person of ordinary skill in the art will understand, a system like the general type shown in FIG. 5 is beneficially impacted by the current invention in critical ways, including better range, better reception, lower power, and longer battery life. These system-level improvements are specifically enabled by the current invention since a number of RF standards require high linearity and low power consumption while increasing power output efficiently. In order to comply with system standards or customer requirements, the current invention is therefore critical to systems like the general type shown in FIG. 5. The current invention therefore specifically defines a system-level embodiment that is creatively enabled by its inclusion in systems like the general type shown in FIG. 5.

Methods

Figure 6:
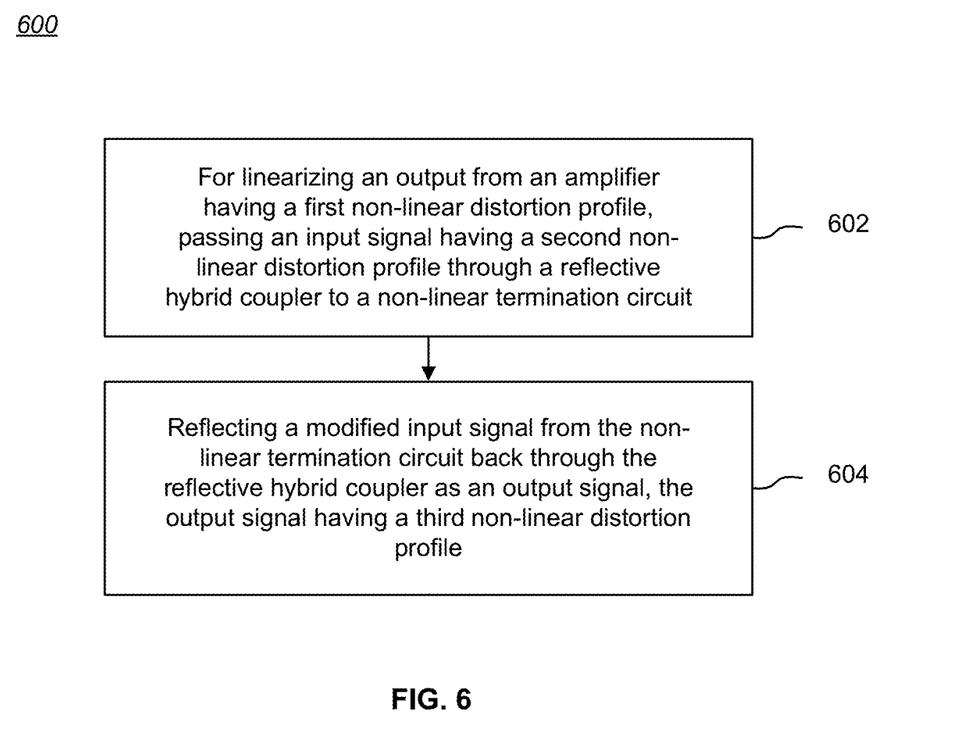
FIG. 6 is a process flow chart showing one method of linearizing an output from an amplifier having a first non-linear distortion profile.

Another aspect of the invention includes methods for linearizing an output from an amplifier. For example, FIG. 6 is a process flow chart 600 showing one method of linearizing an output from an amplifier having a first non-linear distortion profile (such as an AM-PM profile and/or an AM-AM profile). The method includes: passing an input signal having a second non-linear distortion profile through a reflective hybrid coupler to a non-linear termination circuit (Block 602); and reflecting a modified input signal from the non-linear termination circuit back through the reflective hybrid coupler as an output signal, the output signal having a third non-linear distortion profile (Block 604).

Additional aspects of the above method may include one or more of the following: wherein the non-linear termination circuit includes a first reflective modulation device coupled to a direct port of the reflective hybrid coupler, and a second reflective modulation device coupled to a coupled port of the reflective hybrid coupler; wherein the first and second reflective modulation devices include respective first and second field-effect transistors (FETs) each having a gate, a drain, and a source, wherein the gate of the FET of the first reflective modulation device is coupled to the direct port of the reflective hybrid coupler, and the gate of the FET of the second reflective modulation device is coupled to the coupled port of the reflective hybrid coupler; wherein the gate of the FET of the first reflective modulation device is capacitively coupled to the direct port of the reflective hybrid coupler, and the gate of the FET of the second reflective modulation device is capacitively coupled to the coupled port of the reflective hybrid coupler; wherein the drain of the FET of the first reflective modulation device is coupled to a voltage through a first load inductor, and the drain of the FET of the second reflective modulation device is coupled to a voltage through a second load inductor; wherein the drains of the FETs of the first and second reflective modulation devices are coupled to a voltage through a common load inductor; wherein the gates of the FETs of the first and second reflective modulation devices are coupled to respective bias voltages; and/or wherein the third non-linear distortion profile is shaped to compensate for the first non-linear distortion profile.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

Conclusion

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A linearizer circuit, including:
   (a) a reflective hybrid coupler configured to receive an input signal to be linearized, the input signal having a first non-linear distortion profile; and
   (b) a non-linear termination circuit coupled to the reflective hybrid coupler and configured to reflect a modified input signal back through the reflective hybrid coupler as an output signal, the output signal having a second non-linear distortion profile, wherein the non-linear termination circuit includes:
      (1) a first reflective modulation device including a first field-effect transistor (FET) having a gate, a drain, and a source, wherein the gate of the first FET is coupled to the direct port of the reflective hybrid coupler; and
      (2) a second reflective modulation device including a second FET having a gate, a drain, and a source, wherein the gate of the second FET is coupled to the coupled port of the reflective hybrid coupler;
   (c) a first load inductor coupled to the drain of the first FET of the first reflective modulation device and configured to be coupled to a voltage supply; and
   (d) a second load inductor coupled to the drain of the second FET of the second reflective modulation device and configured to be coupled to the voltage supply.

2. The invention of claim 1, wherein the gate of the first FET of the first reflective modulation device is capacitively coupled to the direct port of the reflective hybrid coupler, and the gate of the second FET of the second reflective modulation device is capacitively coupled to the coupled port of the reflective hybrid coupler.

3. A linearizer circuit, including:
   (a) a reflective hybrid coupler configured to receive an input signal to be linearized, the input signal having a first non-linear distortion profile; and
   (b) a non-linear termination circuit coupled to the reflective hybrid coupler and configured to reflect a modified input signal back through the reflective hybrid coupler as an output signal, the output signal having a second non-linear distortion profile, wherein the non-linear termination circuit includes:
      (1) a first reflective modulation device coupled to a direct port of the reflective hybrid coupler, the first reflective modulation device including a first field-effect transistor (FET) having a gate, a drain, and a source, wherein the gate of the first FET is coupled to the direct port of the reflective hybrid coupler; and
      (2) a second reflective modulation device coupled to a coupled port of the reflective hybrid coupler, the second reflective modulation device including a second FET having a gate, a drain, and a source, wherein the gate of the second FET is coupled to the coupled port of the reflective hybrid coupler;
   (c) a common load inductor having a first terminal coupled to a voltage and a second terminal coupled to each of the drains of the respective first and second FETs of the first and second reflective modulation.

4. The invention of claim 1, wherein the respective gates of the first and second FETs of the first and second reflective modulation devices are coupled to respective bias voltages.

5. The invention of claim 1, wherein the second non-linear distortion profile is shaped to compensate for a third non-linear distortion profile imposed on the output signal by another device.

6. The invention of claim 5, wherein the other device includes an amplifier.

7. A linearizer circuit, including:
   (a) a reflective hybrid coupler configured to receive an input signal to be linearized, the input signal having a first amplitude-to-phase modulation (AM-PM) profile, the reflective hybrid coupler including:
      (1) an input port for receiving the input signal;
      (2) a direct port;
      (3) a coupled port; and
      (4) an output port;
   (b) a first reflective modulation device including a first field-effect transistor (FET) having a gate, a drain, and a source, wherein the gate of the first FET is coupled to the direct port of the reflective hybrid coupler;
   (c) a second reflective modulation device including a second FET having a gate, a drain, and a source, wherein the gate of the second FET is coupled to the coupled port of the reflective hybrid coupler;
   (d) a first load inductor coupled to the drain of the first FET of the first reflective modulation device and configured to be coupled to a voltage supply; and
   (e) a second load inductor coupled to the drain of the second FET of the second reflective modulation device and configured to be coupled to the voltage supply;
wherein the first and second reflective modulation devices modify the first AM-PM profile of the input signal to a modified output signal having a second AM-PM profile.

8. The invention of claim 7, wherein the gate of the first FET of the first reflective modulation device is capacitively coupled to the direct port of the reflective hybrid coupler, and the gate of the second FET of the second reflective modulation device is capacitively coupled to the coupled port of the reflective hybrid coupler.

9. The invention of claim 7, wherein the first load inductor and the second load inductor are the same inductor.

10. The invention of claim 7, wherein the respective gates of the first and second FETs of the first and second reflective modulation devices are coupled to respective bias voltages.

11. The invention of claim 7, wherein the second AM-PM profile is shaped to compensate for a third AM-PM profile imposed on the output signal by another device.

12. The invention of claim 11, wherein the other device includes an amplifier.

13. A linearizer circuit for an amplifier, including:
   (a) a reflective hybrid coupler configured to receive an input signal to be linearized, the input signal having a first amplitude-to-phase modulation (AM-PM) profile, the reflective hybrid coupler including:
      (1) an input port for receiving the input signal;
      (2) a direct port;
      (3) a coupled port; and (4) an output port configured to be coupled to an amplifier having a second AM-PM profile;

(b) a first reflective modulation device including a first field-effect transistor (FET) having a gate, a drain, and a source, wherein the gate of the first FET is coupled to the direct port of the reflective hybrid coupler;

(c) a second reflective modulation device including a second FET having a gate, a drain, and a source, wherein the gate of the second FET is coupled to the coupled port of the reflective hybrid coupler;

(d) a first load inductor coupled to the drain of the first FET of the first reflective modulation device and configured to be coupled to a voltage supply; and (e) a second load inductor coupled to the drain of the second FET of the second reflective modulation device and configured to be coupled to the voltage supply;

wherein the first and second reflective modulation devices modify the first AM-PM profile of the input signal to a modified output signal having a third AM-PM profile that is provided to the amplifier through the output port of the reflective hybrid coupler, the third AM-PM profile compensating the second AM-PM profile to a more linear AM-PM profile for an amplified output signal from the amplifier.

14. The invention of claim 13, wherein the gate of the first FET of the first reflective modulation device is capacitively coupled to the direct port of the reflective hybrid coupler, and the gate of the second FET of the second reflective modulation device is capacitively coupled to the coupled port of the reflective hybrid coupler.

15. The invention of claim 13, wherein the first load inductor and the second load inductor are the same inductor.

16. The invention of claim 13, wherein the respective gates of the first and second FETs of the first and second reflective modulation devices are coupled to respective bias voltages.

17. The invention of claim 3, wherein the gates of the respective first and second FETs of the first and second reflective modulation devices are coupled to respective bias voltages.

18. The invention of claim 3, wherein the second non-linear distortion profile is shaped to compensate for a third non-linear distortion profile imposed on the output signal by another device.

19. The invention of claim 18, wherein the other device includes an amplifier.

20. The invention of claim 1, wherein the input signal has a first amplitude-to-phase modulation (AM-PM) profile, the output signal has a second AM-PM profile, and the second AM-PM profile is shaped to compensate the first AM-PM profile for an AM-PM distortion imposed by another device coupled to an output port of the reflective hybrid coupler.

21. The invention of claim 20, wherein the other device comprises an amplifier.

22. The invention of claim 3, wherein the input signal has a first amplitude-to-phase modulation (AM-PM) profile, the output signal has a second AM-PM profile, and the second AM-PM profile is shaped to compensate the first AM-PM profile for an AM-PM distortion imposed by another device coupled to an output port of the reflective hybrid coupler.

23. The invention of claim 22, wherein the other device comprises an amplifier.

* * * * *